United States Patent
Mathijssen et al.

(10) Patent No.: US 9,551,939 B2
(45) Date of Patent: Jan. 24, 2017

(54) MARK POSITION MEASURING APPARATUS AND METHOD, LITHOGRAPHIC APPARATUS AND DEVICE MANUFACTURING METHOD

(71) Applicants: ASML Netherlands B.V., Veldhoven (NL); ASML Holding N.V., Veldhoven (NL)

(72) Inventors: Simon Gijsbert Josephus Mathijssen, Den Bosch (NL); Arie Jeffrey Den Boef, Waalre (NL); Stanley Drazkiewicz, Norwalk, CT (US); Justin Lloyd Kreuzer, Trumbull, CT (US); Gerrit Johannes Nijmeijer, Larchmont, NY (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 46 days.

(21) Appl. No.: 14/428,565

(22) PCT Filed: Sep. 23, 2013

(86) PCT No.: PCT/EP2013/069664
§ 371 (c)(1),
(2) Date: Mar. 16, 2015

(87) PCT Pub. No.: WO2014/056708
PCT Pub. Date: Apr. 17, 2014

(65) Prior Publication Data
US 2015/0234290 A1   Aug. 20, 2015

Related U.S. Application Data

(60) Provisional application No. 61/712,147, filed on Oct. 10, 2012.

(51) Int. Cl.
*G03B 27/72* (2006.01)
*G03F 7/20* (2006.01)
*G01B 11/14* (2006.01)

(52) U.S. Cl.
CPC .......... *G03F 7/70141* (2013.01); *G01B 11/14* (2013.01)

(58) Field of Classification Search
CPC .... G01B 11/14; G03F 7/70141; G03F 9/7069; G03F 9/7088
See application file for complete search history.

(56) References Cited

U.S. PATENT DOCUMENTS

| | | |
|---|---|---|
| 6,023,338 A | 2/2000 | Bareket |
| 6,961,116 B2 | 11/2005 | Den Boef et al. |

(Continued)

FOREIGN PATENT DOCUMENTS

| | | |
|---|---|---|
| JP | 2004-119663 | 4/2004 |
| JP | 2007-225841 | 9/2007 |

(Continued)

OTHER PUBLICATIONS

Japanese Office Action mailed Jan. 22, 2016 in corresponding Japanese Patent Application No. 2015-536046.

(Continued)

*Primary Examiner* — Deoram Persaud
(74) *Attorney, Agent, or Firm* — Pillsbury Winthrop Shaw Pittman LLP

(57) ABSTRACT

An apparatus to measure the position of a mark, the apparatus including an illumination arrangement to direct radiation across a pupil of the apparatus, the illumination arrangement including an illumination source to provide multiple-wavelength radiation of substantially equal polarization and a wave plate to alter the polarization of the radiation in dependency of the wavelength, such that radiation of dif- (Continued)

ferent polarization is supplied; an objective to direct radiation on the mark using the radiation supplied by the illumination arrangement while scanning the radiation across the mark in a scanning direction; a radiation processing element to process radiation that is diffracted by the mark and received by the objective; and a detection arrangement to detect variation in an intensity of radiation output by the radiation processing element during the scanning and to calculate from the detected variation a position of the mark in at least a first direction of measurement.

20 Claims, 7 Drawing Sheets

(56) References Cited

U.S. PATENT DOCUMENTS

| | | | |
|---|---|---|---|
| 7,511,826 B2 | 3/2009 | Kreuzer | |
| 8,593,646 B2 | 11/2013 | Den Boef et al. | |
| 2002/0089723 A1* | 7/2002 | Patel | G02B 6/266 |
| | | | 398/152 |
| 2007/0201034 A1 | 8/2007 | Kreuzer | |
| 2008/0062406 A1* | 3/2008 | Finarov | G01B 11/24 |
| | | | 356/73 |
| 2009/0153825 A1 | 6/2009 | Edart et al. | |
| 2009/0195768 A1 | 8/2009 | Bijnen et al. | |
| 2010/0321654 A1 | 12/2010 | Den Boef | |
| 2011/0007329 A1* | 1/2011 | Woo | G01B 11/06 |
| | | | 356/630 |
| 2011/0032502 A1* | 2/2011 | Nomura | G01J 4/04 |
| | | | 355/71 |
| 2011/0310388 A1* | 12/2011 | Hill | G01N 21/474 |
| | | | 356/369 |
| 2012/0008150 A1* | 1/2012 | Smith | G01B 11/0608 |
| | | | 356/616 |
| 2012/0038929 A1 | 2/2012 | Den Boef et al. | |
| 2012/0044565 A1* | 2/2012 | Wang | G02B 27/283 |
| | | | 359/325 |
| 2012/0062863 A1 | 3/2012 | Bijnen et al. | |
| 2012/0212718 A1 | 8/2012 | Den Boef | |
| 2012/0212749 A1 | 8/2012 | Den Boef et al. | |
| 2012/0327503 A1* | 12/2012 | Manassen | G01J 1/4257 |
| | | | 359/291 |
| 2015/0355554 A1* | 12/2015 | Mathijssen | G03F 9/7046 |
| | | | 355/67 |
| 2016/0161864 A1* | 6/2016 | Middlebrooks | G03F 7/70633 |
| | | | 355/67 |

FOREIGN PATENT DOCUMENTS

| | | |
|---|---|---|
| JP | 2007-273954 | 10/2007 |
| JP | 2008-532320 | 8/2008 |
| JP | 2009-147317 | 7/2009 |
| TW | I298824 | 7/2008 |
| TW | 201239554 | 10/2012 |
| WO | 2008/052405 | 5/2008 |

OTHER PUBLICATIONS

International Search Report and Written Opinion mailed Apr. 28, 2014 Patent Application No. PCT/EP2013/069664.
Taiwan Office Action dated Aug. 13, 2015 in corresponding Taiwan Patent Application No. 102136624.

* cited by examiner (a)

(b)

(a)

(b)

(a)

(b)

MARK POSITION MEASURING APPARATUS AND METHOD, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/069664, which was filed on Sep. 23, 2013, which claims the benefit of priority of U.S. provisional patent application No. 61/712,147, which was filed on Oct. 10, 2012, and which is incorporated herein in its entirety by reference.

FIELD

The present invention relates to a mark position measuring apparatus and method. The invention further relates to a lithographic apparatus comprising such a mark position measuring apparatus, and a method for manufacturing a device using the mark position measuring method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which a position of a mark on the substrate is measured accurately. The alignment sensor is effectively a position measuring apparatus. Different types of marks and different types of alignment sensors are known from different times and different manufacturers. A type of sensor used in current lithographic apparatus is based on a self-referencing interferometer as described in U.S. Pat. No. 6,961,116, the contents of which is incorporated herein its entirety. Generally the mark is measured separately to obtain X- and Y-positions. A combined X- and Y-measurement can be performed using the techniques described in U.S. patent application publication no. US 2009/195768, the contents of which is incorporated herein its entirety.

SUMMARY

Although there are already developments in which multiple-wavelength radiation is used to illuminate a mark, there is a desire to increase the number of wavelengths and corresponding polarizations. However, using multiple sources with fixed polarization is not an attractive option to increase the number of wavelengths and polarizations.

A solution to using multiple sources with fixed polarization is to use a broadband illumination source, such as a white light laser, in combination with a radiation processing device, wherein the position where the radiation is supplied to the radiation processing device among other things determines the polarization state of the radiation leaving the radiation processing device. Switching polarization is then realized by switching between radiation supply positions as described in U.S. patent application No. 61/623,391, filed Apr. 12, 2012. This involves scanning each mark twice or switching polarization quickly during a scan. Both solutions may not be satisfactory.

It is desirable, for example, to provide a position measurement apparatus, for example an alignment sensor in a lithographic apparatus, which allows the use of multiple-wavelength radiation with multiple polarizations in a convenient way.

According to an embodiment of the invention, there is provided an apparatus to measure a position of a mark, the apparatus comprising:
an illumination arrangement to direct radiation with an illumination profile across a pupil of the apparatus;
an objective lens to direct radiation on the mark using the radiation supplied by the illumination arrangement while scanning the radiation across the mark in a scanning direction;
a radiation processing element to process radiation that is diffracted by the mark and received by the objective lens; and
a detection arrangement to detect variation in an intensity of radiation output by the radiation processing element during the scanning and to calculate from the detected variation a position of the mark in at least a first direction of measurement.
wherein the illumination arrangement comprises an illumination source to provide multiple-wavelength radiation of substantially equal polarization, and
wherein the illumination arrangement further comprises a wave plate to alter the polarization of the radiation in dependency of the wavelength, such that radiation of different polarization is supplied to the objective lens.

According to an embodiment of the invention, there is provided a method of measuring a position of a mark on a substrate, the mark comprising features periodic in at least a first direction, the method comprising:
providing multiple-wavelength radiation of substantially equal polarization;
altering the polarization of the radiation in dependency of wavelength;
illuminating the mark with radiation having different polarizations and receiving radiation diffracted by the mark via an objective lens;
processing the diffracted radiation in a radiation processing element;
detecting variation in an intensity of radiation output by the radiation processing element while scanning the mark with the radiation;
calculating from the detected variations a position of the mark in at least a first direction of measurement.

According to an embodiment of the invention, there is provided a lithographic apparatus arranged to transfer a pattern from a patterning device onto a substrate, the apparatus comprising a substrate table constructed to hold a substrate and an alignment sensor configured to measure the position of a mark relative to a reference frame of the lithographic apparatus, wherein the alignment sensor comprises a measuring apparatus as described herein, and wherein the lithographic apparatus is arranged to control the transfer of a pattern onto the substrate by reference to the positions of the mark measured using the measuring apparatus.

According to an embodiment of the invention, there is provided a method of manufacturing a device in which a lithographic process is used to transfer a pattern from a patterning device onto a substrate, and wherein the transfer of a pattern onto the substrate is controlled by reference to a position of a mark measured using a method as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2(a) and FIG. 2(b), illustrates various forms of an alignment mark that may be provided, for example, on a substrate in the apparatus of FIG. 1;

DETAILED DESCRIPTION

Figure 1:
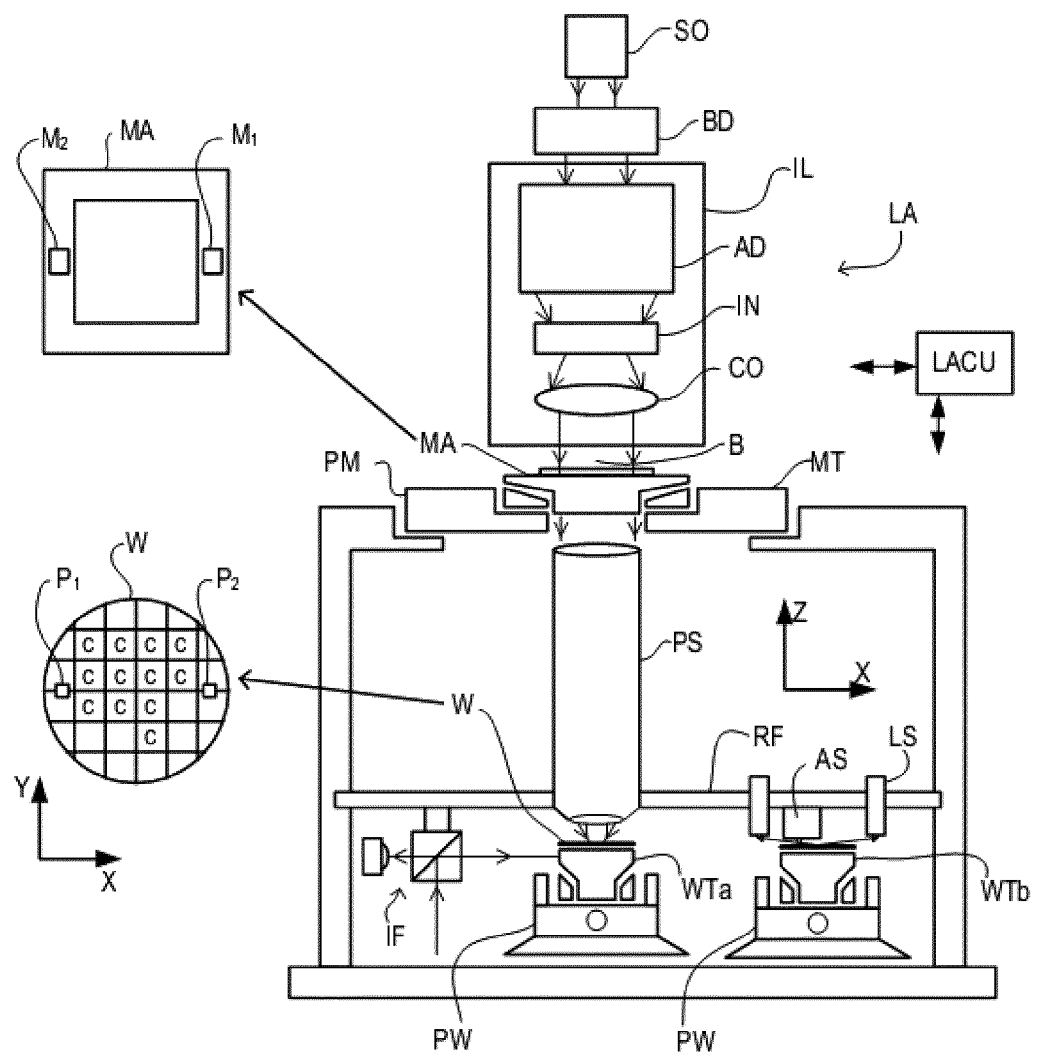
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa and WTb and two stations—an exposure station and a measurement station—between which the tables can be exchanged. For example, while one substrate on one substrate table is being exposed at the exposure station, another substrate can be loaded onto the other substrate table at the measurement station so that various preparatory steps may be carried out. In an embodiment, one table is a substrate table and another table is a measurement table including one or more sensors. Preparatory steps may be performed at the measurement station such as mapping the surface of the substrate using a level sensor LS and/or measuring the position of one or more alignment markers on, for example, the substrate using an alignment sensor AS. Such preparatory steps enable a substantial increase in the throughput of the apparatus. If the position sensor IF is not capable of measuring the position of the table while it is at the measurement station as well as at the exposure station, a second position sensor may be provided to enable the positions of the table to be tracked at both stations.

The apparatus further includes a lithographic apparatus control unit LACU which controls the movements and measurements of the various actuators and sensors described. Control unit LACU also includes signal processing and data processing capacity to implement desired calculations relevant to the operation of the apparatus. In practice, control unit LACU may be realized as a system of many sub-units, each handling the real-time data acquisition, processing and control of a subsystem or component within the apparatus. For example, one processing subsystem may be dedicated to servo control of the positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
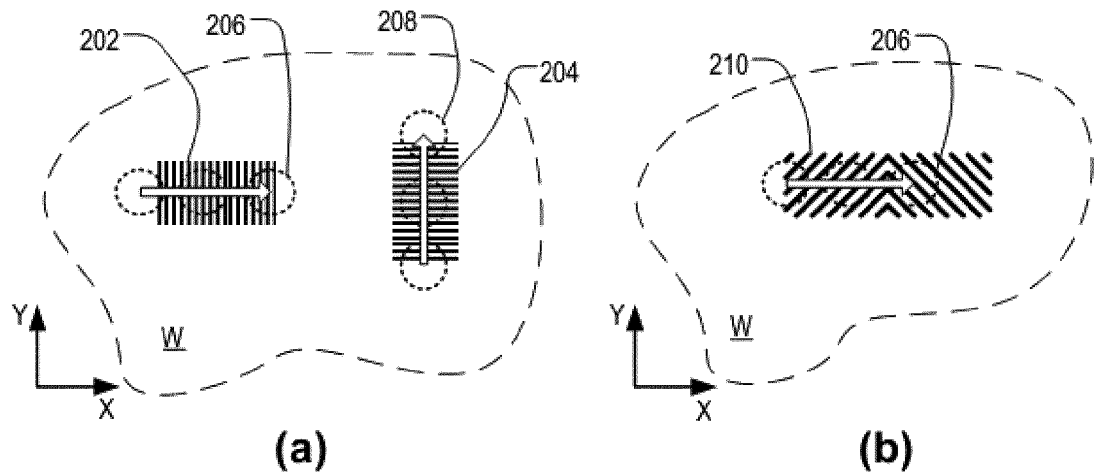
FIG. 2, comprising

FIG. 2(a) shows examples of alignment marks 202, 204, provided on substrate W for the measurement of X-position and Y-position, respectively. Each mark in this example comprises a series of bars formed in a product layer or other layer applied to or etched into, for example, the substrate. The bars are regularly spaced and act as grating lines so that the mark can be regarded as a diffraction grating with a known spatial period (pitch). The bars on the X-direction mark 202 are substantially parallel to the Y-axis to provide periodicity in the X-direction, while the bars of the Y-direction mark 204 are substantially parallel to the X-axis to provide periodicity in the Y-direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of, for example, substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying a pattern to the substrate. Fine position information can be obtained because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are known to the person skilled in the art, and will not be detailed herein. The design and operation of such a sensor is known in the art, and each lithographic apparatus may have its own design of sensor. For the purpose of the present description, it will be assumed that the alignment sensor AS is generally of the form described in U.S. Pat. No. 6,961,116, the contents of which is incorporated herein in its entirety by reference. FIG. 2(b) shows a modified mark for use with a similar alignment system, in which X- and Y-positions can be obtained through a single optical scan with the illumination spot 206. The mark 210 has bars arranged at substantially 45 degrees to both the X- and Y-axes. This combined X- and Y-measurement can be performed using the techniques described in U.S. patent application publication no. US 2009/195768, the contents of which is incorporated herein in its entirety by reference.

Figure 3:
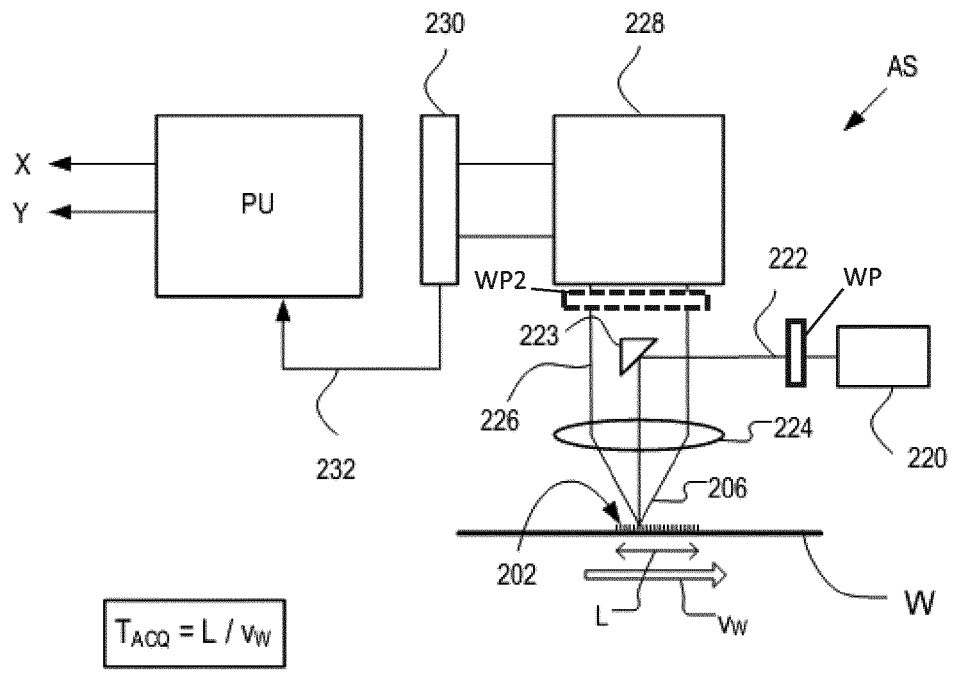
FIG. 3 is a schematic block diagram of an alignment sensor according to an embodiment of the invention scanning an alignment mark in the apparatus of FIG. 1.

FIG. 3 is a schematic block diagram of an alignment sensor AS according to an embodiment of the invention. Illumination source 220 provides a beam 222 of multiple-wavelength radiation of certain polarization, which is diverted by a spot mirror 223 through an objective lens 224 onto a mark, such as mark 202, located on, for example, substrate W. As indicated schematically in FIG. 2, in the example of the present alignment sensor based on U.S. Pat. No. 6,961,116 mentioned above, the illumination spot 206 by which the mark 202 is illuminated may be slightly smaller in width (e.g., diameter) then the width of the mark itself.

Before the multiple-wavelength radiation is diverted into the objective lens 224 by spot mirror 223, the multiple-wavelength radiation passes a wave plate WP to alter the polarization of the radiation in dependency of the wavelength, such that radiation of different polarization is supplied to the objective lens. The illumination source and the wave plate may be part of an illumination arrangement.

The wave plate, which may alternatively be referred to as retarder, is desirably constructed out of at least one birefringent material, e.g. in the form of a crystal, of which the index of refraction is different for different orientations of radiation travelling through the wave plate. The behavior of the wave plate depends on the thickness of the wave plate, the wavelength of the radiation traveling through the wave plate, and the variation of an index of refraction. The wave plate works by shifting the phase between two substantially perpendicular polarization components of the radiation.

Figure 4:
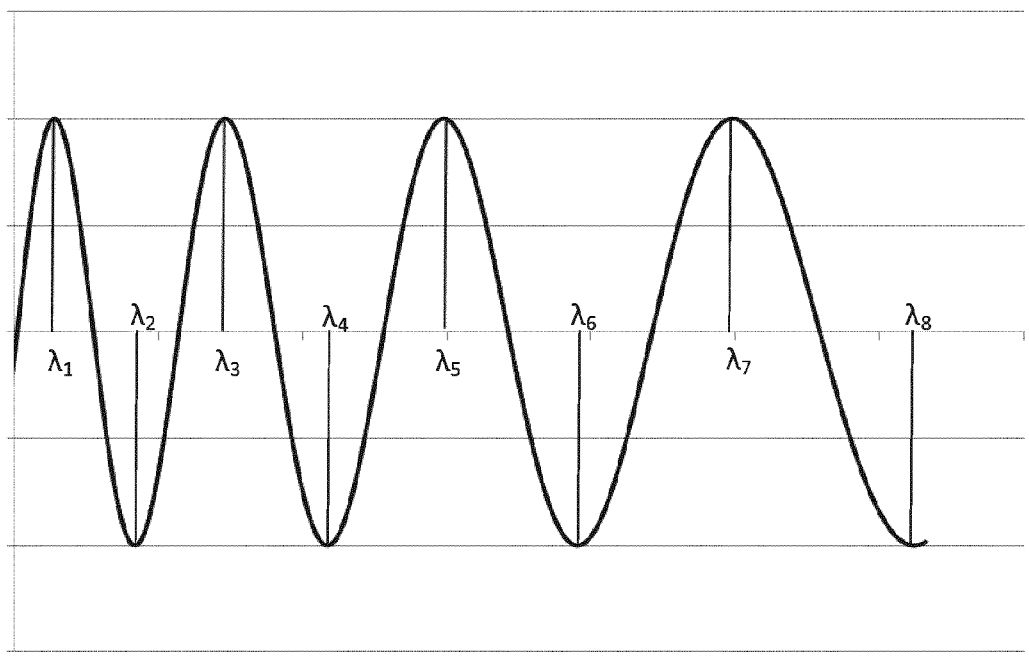
FIG. 4 depicts an example of the phase shift as a function of wavelength induced by a wave plate of certain thickness.

FIG. 4 depicts an example of the polarization as a function of wavelength caused by a wave plate. When the incoming multiple-wavelength radiation has a certain polarization state, the wave plate causes a different phase shift for each wavelength as indicated by FIG. 4. This causes the polarization to be periodic as a function of wavelength. In this example, the maximum polarization in FIG. 4 corresponds to a linear polarization referred to as s-type polarization, and the minimum polarization in FIG. 4 corresponds to a linear polarization referred to as p-type polarization, wherein the p-type polarization is orthogonal to the s-type polarization. In between the maximum and minimum polarization, the polarization state is elliptic or circular. Hence, due to the wave plate, radiation with wavelengths $\lambda 1$, $\lambda 3$, $\lambda 5$ and $\lambda 7$ is supplied to the objective lens having s-type polarization, and radiation with wavelengths $\lambda 2$, $\lambda 4$, $\lambda 6$ and $\lambda 8$ is supplied to the objective lens having p-type polarization. Radiation having a wavelength in between the aforementioned linear polarized wavelengths is supplied to the objective lens with elliptic or circular polarization. The apparatus may be configured to measure the position of a mark comprising features periodic in at least a first direction, wherein one of the p-type or s-type polarization is substantially parallel to the first direction and the other one of the p-type or s-type polarization is substantially perpendicular to the first direction. The p-type or s-type polarization may also have a certain angle relative to the first direction, e.g. an angle of 22.5 degrees. Hence, by using a broadband illumination source and the wave plate, multiple-wavelength radiation with different polarizations can be supplied to a mark to measure the position of the mark, thereby eliminating the need to use multiple sources and/or to scan the mark twice and/or to switch the polarization quickly during a scan.

The thickness of the wave plate determines, among other things, the behavior of the wave plate and is thus a parameter that can be used to configure or optimize the number of polarization rotations within a certain wavelength range. For instance, the thickness may be chosen such that for a wavelength range of 200 nm to 1400 nm there are five wavelengths having p-type polarization and five wavelengths having s-type polarization.

Referring back to FIG. 3, radiation scattered, i.e. diffracted, by mark 202 is picked up by objective lens 224 and collimated into an information-carrying beam 226. A radiation processing element, in this embodiment a self-referencing interferometer 228 of the type disclosed in U.S. Pat. No. 6,961,116 mentioned above, processes beam 226 and outputs separate beams onto a sensor array 230. Spot mirror 223 may serve conveniently as a zero order stop at this point, so that the information carrying beam 226 comprises substantially only higher order diffracted radiation from the mark 202 (this is not essential to the measurement, but improves signal to noise ratios). Intensity signals 232 from individual sensors in sensor grid 230 are provided to a processing unit PU. By a combination of the optical processing in the block 228 and the computational processing in the unit PU, values for X- and Y-position of the mark (or other structure) relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

The radiation processing element may be configured to only properly process radiation with certain polarization states, for instance only the linear polarizations of λ1 to λ8. The other polarization states will be processed if present, but in a way that may not be convenient for further processing. Hence, information may be lost, e.g. the information contained in the radiation with elliptic or circular polarization. To solve this, a second wave plate WP2 may be provided which reverses the effect of the wave plate WP, i.e. the second wave plate is configured to alter the polarization state of the radiation in dependency of the wavelength such that the radiation supplied by the objective lens after passing the second wave plate comprises multiple-wavelength radiation of substantially equal polarization. In an embodiment, this can be achieved by aligning the fast axis of the second wave plate WP2 with the slow axis of the wave plate WP1. Hence, wave plate WP encodes the broadband radiation with polarization and the second wave plate WP2 decodes the broadband radiation. As a result, the radiation leaving the second wave plate has a substantially equal polarization state for all wavelengths. When this polarization state can be properly processed by the radiation processing element, all wavelengths can be properly processed by the radiation processing element and more information can be obtained from the apparatus.

The second wave plate WP2 is indicated by dashed lines in FIG. 3 as this element is not per se necessary. The second wave plate WP2 does not have to be equal in construction to the wave plate WP, but may be made from a different material as long as the phase shift behavior is substantially equal. From a practical point of view, a single birefringent crystal may be formed which is split into two substantially equal pieces in order to obtain the wave plate WP and the second wave plate WP2.

As mentioned already, a single measurement of the type illustrated only fixes the position of the mark within a certain range corresponding to one pitch of the mark. Coarser measurement techniques are used in conjunction with this to identify which period of the sine wave is the one containing the mark's position. The same process at coarse and/or fine level can be repeated at different wavelengths for increased accuracy, and for robust detection of the mark irrespective of the materials from which the mark is made, and on which it sits. The wavelengths can be multiplexed and demultiplexed optically so as to be processed simultaneously, and/or they may be multiplexed by time division or frequency division.

Referring to the measurement process in more detail, an arrow labeled VW in FIG. 3 illustrates a scanning velocity with which spot 206 traverses the length L of mark 202. In this example, the alignment sensor AS and spot 206 remain stationary, while it is the mark 202 (e.g., on substrate W or table WT) that moves with velocity VW. The alignment sensor can thus be mounted rigidly and accurately to the reference frame RF (FIG. 1), while effectively scanning the mark 202 in a direction opposite to the direction of movement of the mark 202. The mark is controlled in this movement by, e.g., its location on the substrate table WT and the substrate positioning system PW.

As discussed in U.S. patent application publication no. US 2012-0212749, the contents of which is incorporated herein in its entirety by reference, to facilitate the high productivity requirements of a lithographic apparatus, the measurement of the alignment marks at numerous positions should be performed as quickly as possible, which implies that the scanning velocity VW is fast, and the time TACQ available for acquisition of each mark position is correspondingly short. In simplistic terms, the formula TACQ=L/VW applies. U.S. patent application publication no. US 2012-0212749 describes a technique to impart an opposite scanning motion of the spot, so as to lengthen the acquisition time. The same scanning spot techniques can be applied in sensors and methods of the type disclosed herein, if desired.

Figure 5:
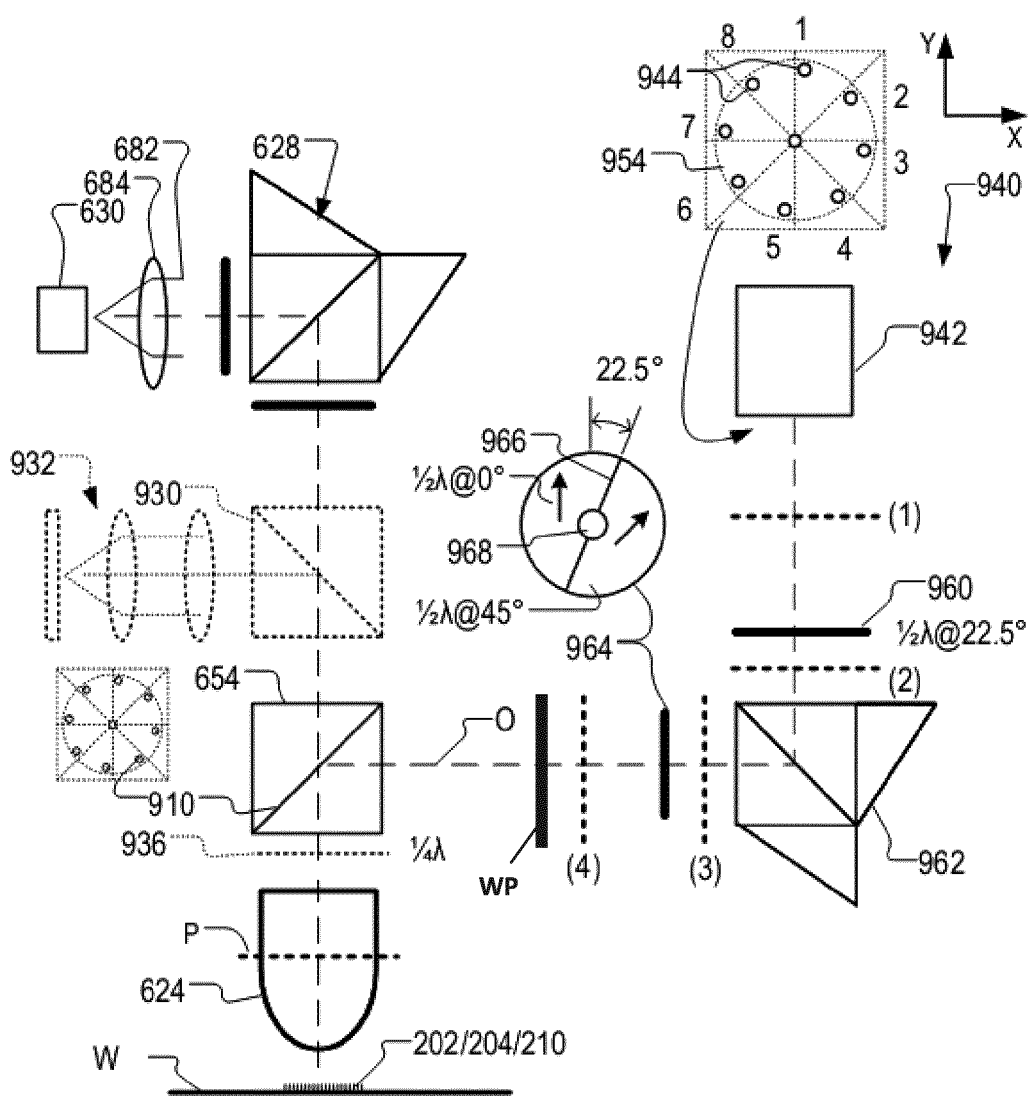
FIG. 5 depicts a schematic diagram of a position measuring apparatus implementing off-axis illumination according to an embodiment of the invention.

FIG. 5 shows a schematic drawing of an apparatus usable in various modes according to mark type and polarization. The proposed assembly enables off-axis illumination using a self-referencing interferometer in the illumination branch. The apparatus will be described firstly with no beams shown, only the optical axis O. For ease of comparison with the schematic diagram of FIG. 3, some parts of the optical system are labeled with reference signs similar to those used in FIG. 3, but with prefix "9" instead of "2". Thus an illumination subsystem 940 is seen, which has special characteristics to be described in more detail below. Further shown are a beam splitter 654, objective lens 624 having a pupil plane P and self-referencing interferometer 628. Interferometer 628 splits the radiation field into two equal parts, rotates these parts by 180° relative to one another, and recombines them into an outgoing beam 682. The interferometer is drawn as a two-dimensional representation of a complex three-dimensional shape. A lens 684 focuses the entire field onto detector 630.

FIG. 5 shows various optional features that can be provided in the apparatus. Spatial resolution at detector 630 is not required for the position measurements, but it can be provided, of course for other purposes. The FIG. 5 apparatus optionally includes an additional beam splitter 930 which diverts a fraction of the information-carrying radiation into a camera arrangement 932. This camera can record pupil plane images of the radiation, for angle-resolved scatterometry and/or other purposes. Another option is to include a quarter wave plate 936 between beam splitter 654 and objective 624. The function of these will be described later.

Figure 6:
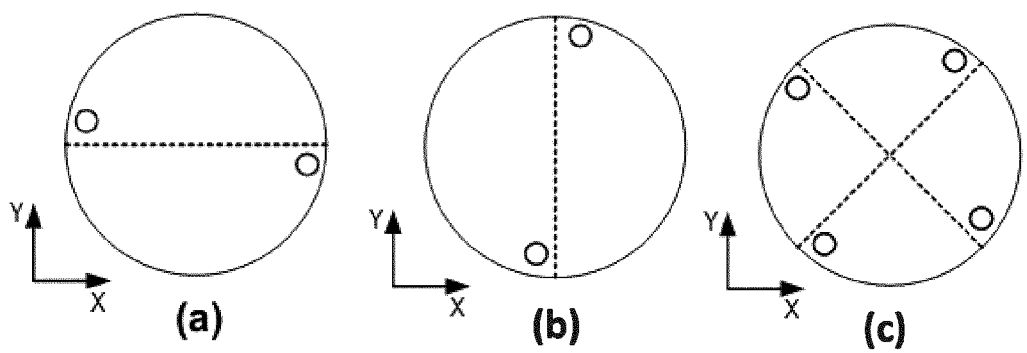
FIG. 6 depicts various off-axis illumination profiles.

As mentioned already, the FIG. 5 apparatus is designed to implement directly selectable illumination modes having illumination profiles illustrated in FIG. 6 at (a), (b) and (c). First, an illumination source 942 is designed to concentrate all the available illumination into a fine spot 944 having substantially the angular and radial extents desired for the illumination profile below beam splitter 654. The position of the spot 944 may be movable within an entrance pupil 954 of the optical system and can be moved or, in this example, can be selected from nine predetermined positions, referred to herein as source feed positions. These are positions labeled 1 to 8 spaced at 45° intervals around the periphery of the pupil, plus a center position. Separate optical fibers are suitable to provide these, although a single fiber that moves physically between positions can also be envisaged. To produce all the illumination modes of FIG. 6, actually only four source feed positions are required (e.g. positions 1 to 4), as will be seen. The center spot is provided simply to allow on-axis illumination to be used, when desired.

The illumination emerging from the illumination source 942 is broadband in nature, for example white light, and may alternatively be referred to as multiple-wavelength radiation. A diversity of wavelengths in the beam increases the robustness of the measurement. The source feed positions 1 to 8 are not directly on the X, Y and XY axes, but rather are offset. They could be placed on the axes if preferred. This merely introduces a risk of interference between diffraction orders at certain combinations of wavelength and grating pitch.

Further components of the illumination system are a half wave plate 960, a prism device 962 and a modified half wave plate 964. Prism device 962 can be for example identical to the self-referencing interferometer 628, and consequently is effective to produce a coherent pair of spots diametrically opposed to one another, with positions determined by the position of the single spot selected at source 942. That is to say, radiation can be supplied at a desired pair of source regions by selecting a suitable source feed position. Prism device 962 will be referred to hereinafter as the "input interferometer" 962, to distinguish it from the interferometer 628 that processes the information-carrying radiation from the mark. In practice, the "input interferometer" 962 and the interferometer 628 may be the same device, but for explanation purposes the interferometers are shown as separate devices. Input interferometer 962 has principal axes aligned with the X and Y axes of the pupil, and is designed to perform its rotate-and-combine function when supplied with radiation at 45° polarization. Half wave plate 960 has a fast axis oriented at 22.5° to the X or Y axis, and serves to change radiation emanating from the source with an X or Y polarization into radiation with a 45° polarization. The effect of a half wave plate is nil where the polarization of incoming radiation is aligned with the fast axis. Otherwise, its effect is to reflect the polarization direction in the direction of the fast axis. The plate 960 could be omitted if 45° polarized radiation is emitted directly by suitable design of the source 942.

Modified half wave plate 964 located downstream of the input interferometer is a component designed specifically for this application, but potentially has wide utility. Its novel characteristic is that it has a different orientation of fast axis at different points around the optical axis. The example has in particular a split 966 such that one half has its fast axis oriented substantially parallel to one of the X and Y axes, while the other half has its fast axis at 45° to the X and Y axes. More generally, it is a feature of the plate 964 that the fast axis at first location is at 45° to the fast axis at a second location diametrically opposite the first location. This condition could be satisfied with more segments, but a simple split 966 in this example is sufficient. The split 966 is angled at 22.5° to the Y axis. Choosing this angle allows the split to avoid interfering with any of the source feed positions, and also facilitates the manufacture of the modified plate. Specifically, a split plate as shown can be formed from a single, uniform half wave plate by cutting it in two along a line at 22.5° to the fast axis, flipping over one of the halves, and mounting them together again. Choice of 22.5° to the Y axis is arbitrary, so long as the orientation of the fast axes is appropriate to the polarization direction of the incoming radiation, to achieve the function described more fully below. A hole 968 is formed at the optical axis, to permit on-axis illumination to pass unhindered. Of course, it is not important how the pieces are mounted together, so long as they are held somehow in position substantially parallel with one another and suitably positioned around the optical axis. In a practical embodiment, they may be cemented to a plain glass plate for support, or cemented directly to the output face of input interferometer 962.

Downstream of the modified half wave plate, a further wave plate WP is provided to alter the polarization of the incoming radiation in dependency of the wavelength, such that radiation of different polarization can be supplied to the objective lens 624.

In beam splitter 654 spot mirrors 910 are located at eight peripheral positions to serve all the desired off-axis illumination spot positions. A central spot mirror is provided to allow other modes of operation using on-axis illumination. The angular and radial extents of these spots are very small, being for example 2 to 5% of the pupil radius in extent, and similarly small in angular extent (e.g. less than 10 or less than 5 degrees, e.g. 1 to 3 degrees). In an example apparatus with a pupil diameter of 1 cm to 3 cm, for example, each spot may have a diameter of about 0.5 millimeters.

For the purposes of the explanations that follow, various planes (1) to (4) are labeled in the diagram. These are not physical components. The precise locations of these planes is not particularly material, since they are located at places where all rays should be substantially parallel.

FIG. 7(a) illustrates the apparatus of FIG. 5 operating in a first illumination mode, where source feed position 1 is selected and illuminated. When, for example, only the source feed position 1 (e.g., fiber) is on, a pupil plane as drawn in FIG. 7(b) is formed at plane (1). The dot indicates the location of the illumination, and an arrow indicates the polarization direction. Hence, the illumination source 942 provides multiple-wavelength radiation of a certain polarization.

When the beam hits the first half wave plate 960, the polarization is rotated by 45°, as depicted in plane (2) as drawn in FIG. 7(b). Then the beam enters the input interferometer 962 where it is split into two copies, and the copies are rotated 180° relative to one another and recombined. Thus as depicted in plane (3) as drawn in FIG. 7(b), two rays of radiation, orthogonally polarized, are provided, which rays next hit the split half wave plate 964. The orientation of the interface 966 between separate wave plates is indicated by a line in plane (3) as drawn in FIG. 7(b). The effect of a half wave plate is nil where the polarization of incoming radiation is aligned with the fast axis. Otherwise, the effect is to reflect the polarization direction in the direction of the fast axis. Accordingly, where the fast axis is at 45° to incident polarization, the polarization will be rotated by 90°. The polarization of the right ray is rotated by 90° by the split half wave plate 964, while the polarization direction of the left ray remains unchanged, because its polarization is orthogonal to the fast axis. Hence at plane (4) as drawn in FIG. 7(b) an illumination profile is created which is similar to the one of FIG. 6(a) that is suited to illuminate an X mark 202.

When the beam passes the wave plate WP, the polarization of the radiation, which up to now has been substantially equal for all wavelengths, is altered in dependency of the wavelength, so that radiation with different polarizations enters the beam splitter 654.

An advantage is that due to the wave plate WP, which encodes the radiation with polarization information, no switching between source feed positions may be required to illuminate the mark with radiation having different polarizations as described in U.S. patent application No. 61/623, 391. In fact, the source feed positions 5 to 8, including corresponding input fibers if present, may be omitted due to the presence of the wave plate WP which relaxes the alignment of the apparatus. However, as will be shown below, the source feed positions 5 to 8 may be used for other purposes.

Figure 7:
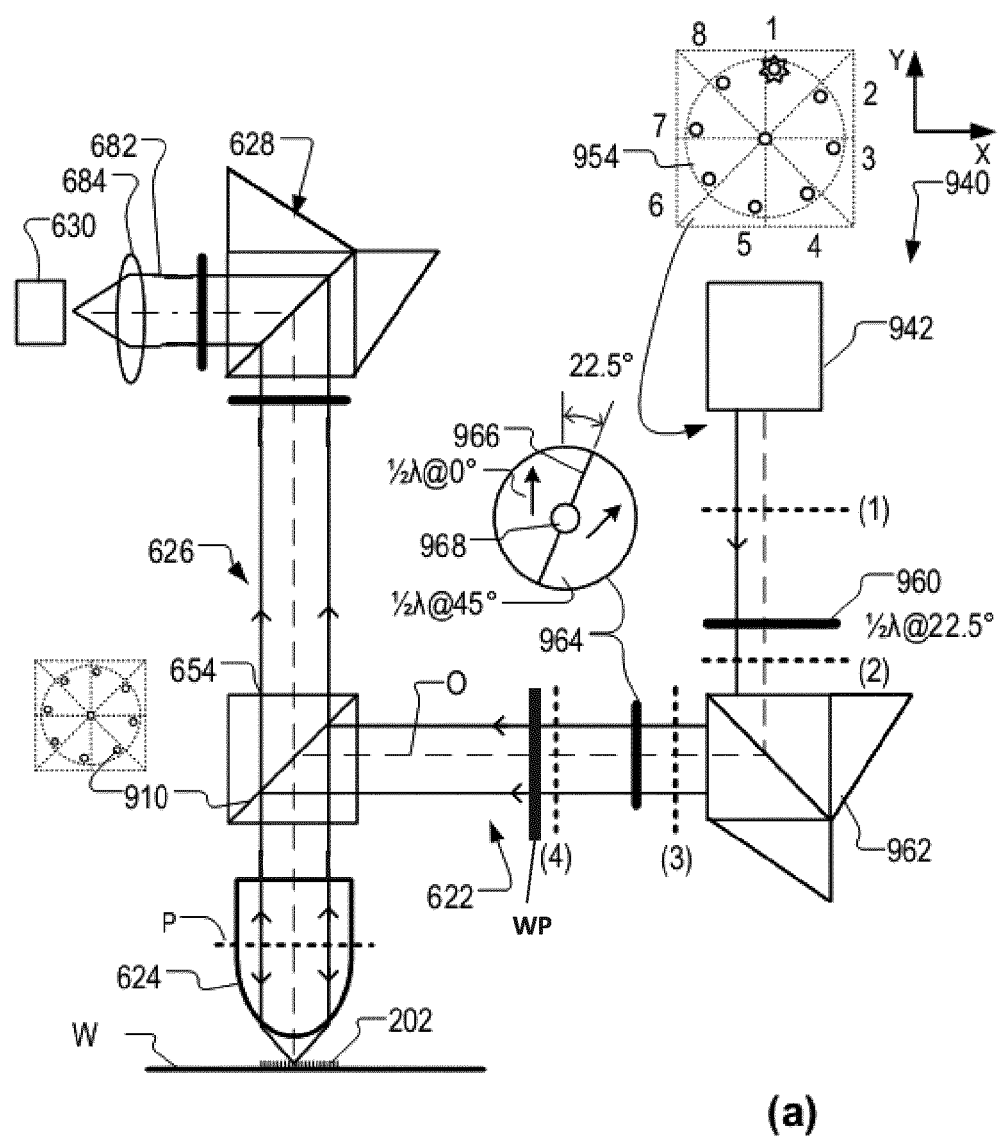
FIGS. 7 to 9 illustrate operation of the apparatus of FIG. 5 to read the position of an X-direction mark with different polarizations relative to grating lines of the mark, and to obtain mark asymmetry information.
Figure 7:
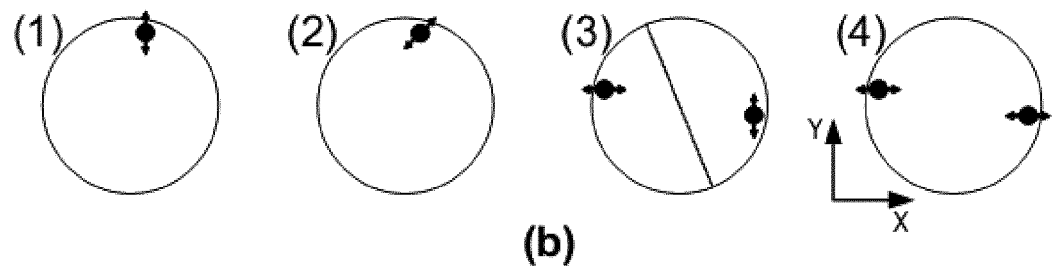
Figure 8:
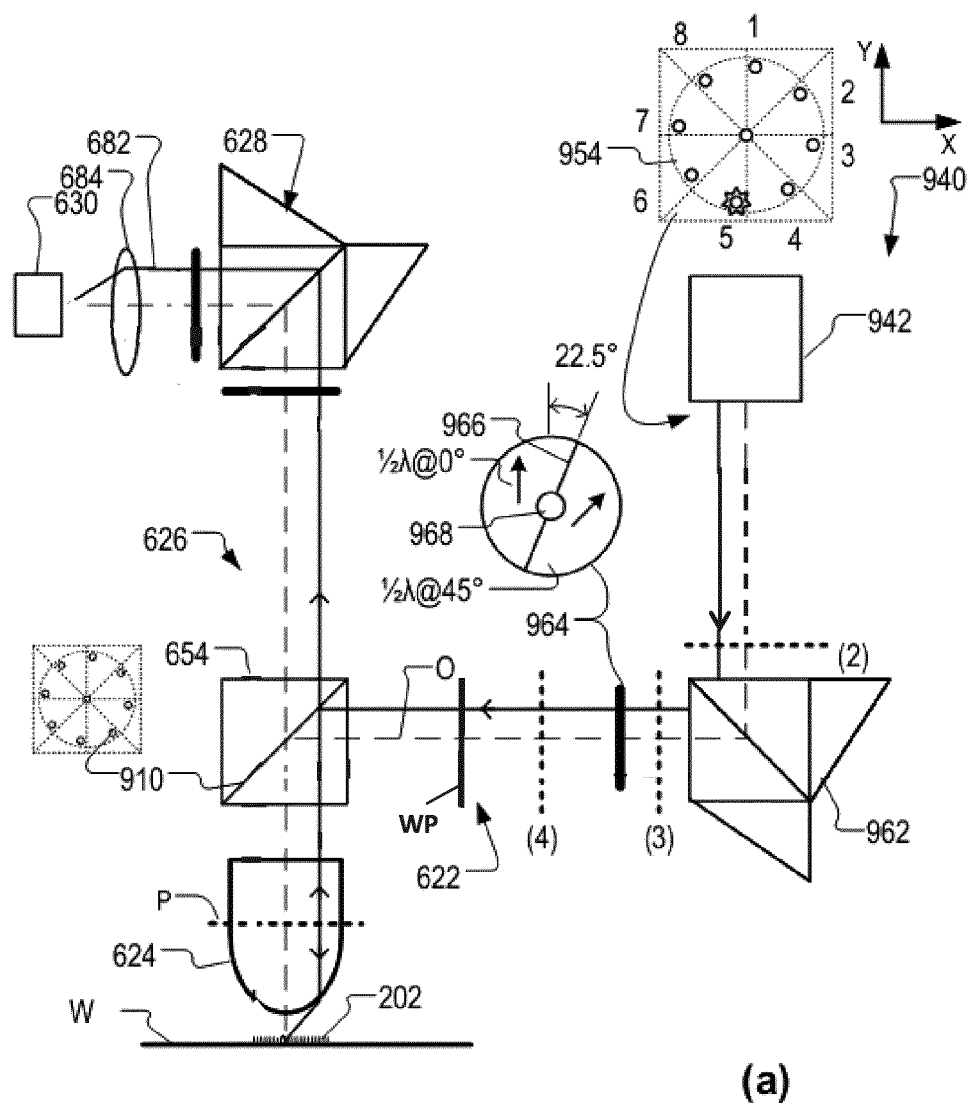
Figure 8:
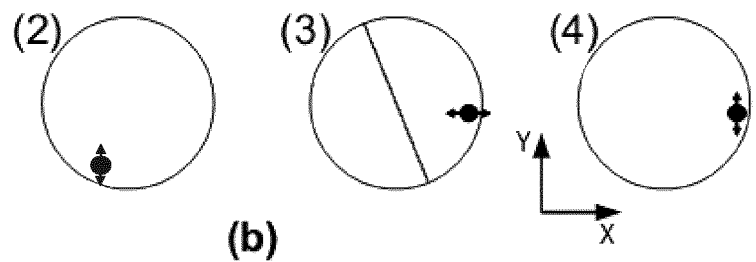
Figure 9:
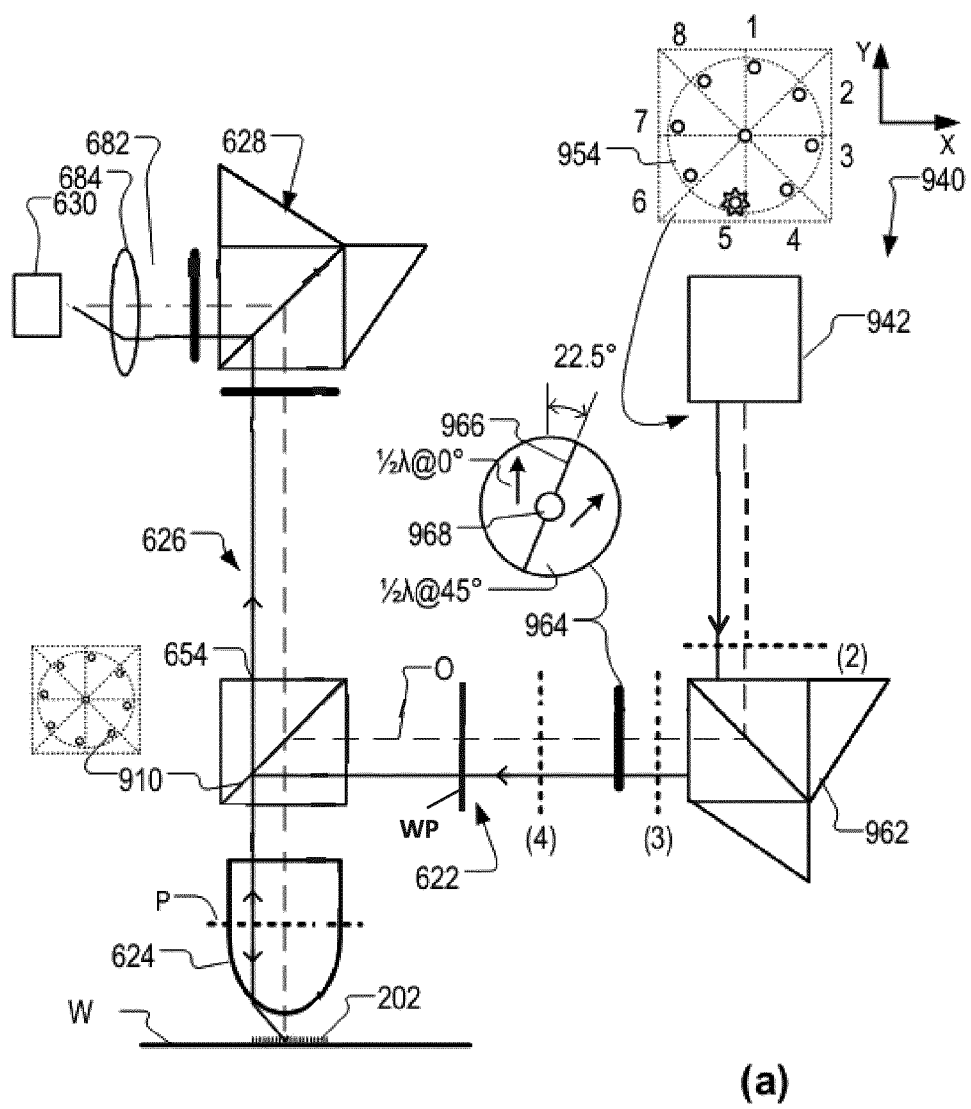
Figure 9:
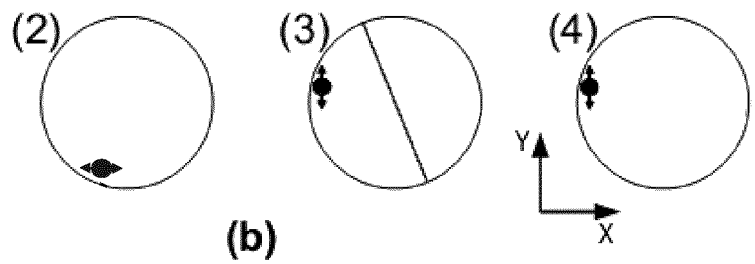

FIGS. 8 and 9 show how an illumination profile that is suited to illuminate an X mark 202 in order to obtain asymmetry information can be created. To do this, the source feed position 5 (e.g., a bottom fiber) is switched on as drawn in FIG. 8(*a*). In FIG. 8(*b*) at (2), the created pupil plane prior to entering the input interferometer 962 is shown, in which the arrow in the dot indicates the polarization direction. The polarization direction in this example is different from the polarization direction when supplying radiation at source feed position 1 (see FIG. 7(*b*) at (2)). To avoid confusion, first half wave plate 960 of FIG. 7(*a*) is omitted in this Figure. It may still be present for the reasons indicated in relation to FIG. 7, but it may be modified in order to allow a different polarization at other source feed positions. For instance, it may be possible that first half wave plate 960 is similar in construction to modified wave plate 964, where the polarization of radiation coming from source feed positions 1 to 4 is rotated 45 degrees, but the polarization of radiation coming from source feed positions 5 to 8 is processed differently.

Subsequently, the beam enters the input interferometer 962 and what comes out is drawn at (3) of FIG. 8(*b*). Note that due to the polarization of the incoming radiation, only one ray of radiation comes out of the interferometer. Due to the fact that the source feed position 5 is diametrically opposite source feed position 1, the polarization of the radiation of source feed position 5 is orthogonal to the polarization of radiation at the same location but coming from source feed position 1.

When the ray of radiation hits the split half wave plate 964 (orientation of the interface line again indicated by the line in (3)), the polarization of the ray is rotated by 90° by the split half wave plate. Subsequently, the polarization is altered by the wave plate WP in dependency of the wavelength.

The result is that only one ray of radiation hits the mark and thus only the diffraction orders of this ray of radiation are captured by the objective lens and processed. As the other ray of radiation is not present, no interference will occur, so that in the end a DC intensity signal may be generated per captured diffraction order which is representative for the asymmetry of the mark. Due to the illumination angle in FIG. 8 only the positive or negative diffraction orders are captured. To obtain information about the intensity of the other diffraction orders, the illumination profile of FIG. 9 can be used. The difference is the polarization of the radiation entering input interferometer 962 which is orthogonal to the polarization in FIG. 8. Due to the different polarization, the other illumination angle is created, so that the objective lens can capture the other diffraction orders and the intensity of these diffraction orders can be measured. Note that due to the fact that the other ray of radiation is generated in FIG. 9, this ray hits the other half of the split half wave plate 964 and thus the polarization is not changed and hence the pupil planes at (3) and (4) are substantially equal.

In an example, radiation according to wavelengths $\lambda 2$, $\lambda 4$, $\lambda 6$, and $\lambda 8$ (see FIG. 4) may be supplied to source feed position 5 with polarization in accordance with the embodiment of FIG. 8 and radiation according to wavelengths $\lambda 1$, $\lambda 3$, $\lambda 5$, and $\lambda 7$ may simultaneously be supplied to source feed position 5 with polarization in accordance with the embodiment of FIG. 9, so that intensity signals from positive and negative diffraction orders are obtained at the same time albeit not at the same wavelength.

An advantage is that the configurations of FIG. 7 and FIG. 8 and/or FIG. 9 may be combined into a single configuration, wherein providing radiation at source feed position 1 as described in relation to FIG. 7 provides an alternating signal as function of the position of the mark to measure the position, and wherein providing radiation at source feed position 5 at the same time as described in relation to FIG. 8 or 9 provides a DC signal representative for mark asymmetry. It is further possible to provide radiation with a polarization in accordance with the situation described for FIG. 8 and radiation of different wavelength with a polarization in accordance with the situation described for FIG. 9 at the same time in order to obtain intensity signals for positive and negative diffraction orders at the same time although at different wavelengths. An advantage is that no pupil dividing elements may be required after diffraction from the mark which could introduce an alignment error or deteriorate the image quality.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus comprising:
   an illumination arrangement to direct radiation with an illumination profile across a pupil of the apparatus, the illumination arrangement comprising an illumination source to provide multiple-wavelength radiation of substantially equal polarization and a wave plate to alter the polarization of the radiation in dependency of the wavelength, such that radiation of different wavelengths having different polarization is supplied;
   an objective lens to direct radiation on a mark using the radiation supplied by the illumination arrangement while scanning the radiation across the mark in a scanning direction;
   a radiation processing element to process radiation that is diffracted by the mark and received by the objective lens; and
   a detection arrangement to detect variation in an intensity of radiation output by the radiation processing element during the scanning and to calculate from the detected variation a position of the mark in at least a first direction of measurement.

2. The apparatus according to claim 1, wherein the multiple-wavelength radiation and the wave plate are matched to each other, such that the multiple-wavelength radiation after passing the wave plate comprises radiation with a first linear polarization direction and radiation with a second linear polarization direction, the first polarization direction being orthogonal to the second linear polarization direction.

3. The apparatus according to claim 1, wherein the radiation processing element is a self-referencing interferometer.

4. The apparatus according to claim 1, wherein the mark comprises features periodic in at least a first direction and the illumination profile comprises radiation from source regions confined to a peripheral portion within a pupil of the objective lens, the source regions comprising at least first and second regions diametrically opposite one another with respect to an optical axis of the objective lens and being limited in angular extent with respect to the optical axis.

5. The apparatus according to claim 4, wherein the illumination arrangement comprises a self-referencing interferometer configured to generate coherent radiation at the first and second source regions from radiation supplied to the illumination arrangement interferometer at a first source feed position, the first and second source regions being determined by the first source feed position, and wherein the wave plate is arranged downstream of the illumination arrangement interferometer.

6. The apparatus according to claim 5, wherein the illumination arrangement further comprises a polarization adjuster to adjust a polarization of the radiation at one of the regions to match the polarization at the other position, when radiation at the first and second source regions emerges from the illumination arrangement interferometer with different polarizations, and wherein the polarization adjuster is arranged in between the illumination arrangement interferometer and the wave plate.

7. The apparatus according to claim 5, wherein the illumination arrangement interferometer is further configured to generate radiation at the first or second source region from radiation supplied to the illumination arrangement at a second source feed position diametrically opposite to the first source feed position with respect to an optical axis of the illumination arrangement interferometer.

8. The apparatus according to claim 1, comprising a second wave plate arranged between the objective lens and the radiation processing element, the second wave plate being configured to alter the polarization state of the radiation in dependency of the wavelength such that the radiation supplied by the objective lens after passing the second wave plate comprises multiple-wavelength radiation of substantially equal polarization.

9. The apparatus according to claim 1, wherein the wave plate is formed by a birefringent crystal.

10. A lithographic apparatus arranged to transfer a pattern from a patterning device onto a substrate, the apparatus comprising a substrate table constructed to hold a substrate and an alignment sensor configured to measure the position of a mark relative to a reference frame of the lithographic apparatus, wherein the alignment sensor comprises the apparatus as claimed in claim 1, and wherein the lithographic apparatus is arranged to control the transfer of a pattern onto the substrate by reference to the position of the mark measured using the measuring apparatus.

11. A method comprising:
   providing multiple-wavelength radiation of substantially equal polarization;
   altering the polarization of the radiation in dependency of wavelength;
   illuminating a mark with radiation of different wavelengths having different polarizations and receiving radiation diffracted by the mark via an objective lens, the mark comprising features periodic in at least a first direction;
   processing the diffracted radiation in a radiation processing element;
   detecting variation in an intensity of radiation output by the radiation processing element while scanning the mark with the radiation; and
   calculating from the detected variations a position of the mark in at least a first direction of measurement.

12. The method according to claim 11, wherein radiation incident to the mark comprises radiation with a linear polarization substantially parallel to the first direction and linear polarization substantially perpendicular to the first direction.

13. The method according to claim 11, wherein radiation incident to the mark comprises radiation of different polarization, and wherein the polarization of the radiation after passing the objective lens and prior to entering the radiation processing element is altered in dependency of wavelength such that multiple-wavelength radiation of substantially equal polarization is obtained.

14. A method of manufacturing a device in which a lithographic process is used to transfer a pattern from a patterning device onto a substrate, and wherein the transfer of a pattern onto the substrate is controlled by reference to the position of a mark measured using the method as claimed in claim 11.

15. The method according to claim 11, wherein the radiation processing element is a self-referencing interferometer.

16. The method according to claim 11, comprising illuminating the mark with radiation from source regions confined to a peripheral portion within a pupil of the objective lens, the source regions comprising at least first and second regions diametrically opposite one another with respect to an optical axis of the objective lens and being limited in angular extent with respect to the optical axis.

17. The method according to claim 16, further comprising generating coherent radiation at the first and second source regions from radiation supplied to an interferometer at a first source feed position, the first and second source regions being determined by the first source feed position, and wherein the wave plate is arranged downstream of the interferometer.

18. The method according to claim 17, further comprising adjusting, using a polarization adjuster, a polarization of the radiation at one of the regions to match the polarization at the other position, when radiation at the first and second source regions emerges from the interferometer with different polarizations, and wherein the polarization adjuster is arranged in between the interferometer and the wave plate.

19. The method according to claim 17, further comprising generating radiation at the first or second source region from radiation supplied at a second source feed position diametrically opposite to the first source feed position with respect to an optical axis of the interferometer.

20. The method according to claim 11, wherein the wave plate is formed by a birefringent crystal.

* * * * *

UNITED STATES PATENT AND TRADEMARK OFFICE
CERTIFICATE OF CORRECTION

PATENT NO.       : 9,551,939 B2  
APPLICATION NO.  : 14/428565  
DATED            : January 24, 2017  
INVENTOR(S)      : Mathijssen et al.

Page 1 of 1

It is certified that error appears in the above-identified patent and that said Letters Patent is hereby corrected as shown below:

On the Title Page

Page 2, item [56], Column 2, Line 2:
replace "2014 Patent Application No. PCT/EP2013/069664"
with --2014 in International Patent Application No. PCT/EP2013/069664.--

Signed and Sealed this
Fourth Day of April, 2017

Michelle K. Lee
*Director of the United States Patent and Trademark Office*